(12) United States Patent
Chirovsky et al.

(10) Patent No.: US 6,485,996 B2
(45) Date of Patent: Nov. 26, 2002

(54) METHOD OF MAKING WAFER HAVING TOP AND BOTTOM EMITTING VERTICAL-CAVITY LASERS

(75) Inventors: Leo Maria Chirovsky, Bridgewater; John Edward Cunningham, Lincroft Township; Keith Wayne Goossen, Aberdeen; Sanghee Park Hui, New Providence; Betty Jyue Tseng, Berkeley Heights, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 94 days.

(21) Appl. No.: 09/769,024

(22) Filed: Jan. 25, 2001

(65) Prior Publication Data

US 2002/0094589 A1 Jul. 18, 2002

Related U.S. Application Data

(62) Division of application No. 09/105,573, filed on Jun. 25, 1998, now Pat. No. 6,222,206.

(51) Int. Cl.[7] ............................................. H01L 27/15
(52) U.S. Cl. ......................... 438/29; 438/34; 438/16; 438/108
(58) Field of Search ............................. 438/34, 29, 16, 438/108

Primary Examiner—George Fourson
(74) Attorney, Agent, or Firm—John A. Caccuro (57) ABSTRACT

A technique is described for determining the performance of substrate-side emitting VCSELs formed on a wafer. The technique involves forming top-emitting VCSELs on the same wafer as bottom-emitting VCSELs and then testing the top-emitting VCSELs and using the results to determine the performance of the bottom-emitting VCSELs of the wafer.

14 Claims, 8 Drawing Sheets

SILICON CHIP 802

METHOD OF MAKING WAFER HAVING TOP AND BOTTOM EMITTING VERTICAL-CAVITY LASERS

This application is a division of Ser. No. 09/105,573 filed on Jun. 25, 1998 now U.S. Pat. No. 6,222,206.

TECHNICAL FIELD OF THE INVENTION

This invention relates to vertical-cavity surface emitting lasers (VCSELs) and, more particularly, to a VCSEL wafer having both bottom-emitting and top-emitting VCSELs formed thereon, the top-emitting VCSELs being used for performance testing purposes.

BACKGROUND OF THE INVENTION

It is desirable to integrate vertical-cavity surface emitting lasers (VCSELs) on semiconductor circuit chips (usually Si CMOS) via flip-chip bonding to reduce packaging costs, increase performance by eliminating parasitic circuit elements such as wire bonds, and allow for the formation of integrated transmitter arrays. It would be particularly useful to integrate 850 nm VCSELs since that wavelength forms a standard for local area fiber-optic networks (the other standard wavelength is 1.3 $\mu$m, where no manufactured VCSEL technology yet exists). In a flip-chip bonded VCSEL, the light must be emitted through the bottom surface, i.e., the substrate side of the VCSEL chip. For 850 nm operation then, the opaque GaAs substrate must be removed. The GaAs substrate is removed after the VCSEL chip is flip-chip bonded to a semiconductor chip (see, e.g., U.S. Pat. No. 5,385,632, issued on Jan. 31, 1995). Unfortunately, this means that the VCSEL chips cannot be tested until they have already been mounted. This destroys one of the major advantages of VCSELs over edge-emitting lasers, which is that VCSELs can be tested on the wafer before cutting the wafer into individual chips. Moreover, if the VCSEL is bad then the bonded VCSEL/semiconductor chip must be discarded. What is desired is a technique to test VCSEL devices while they are still part of the wafer.

SUMMARY OF THE INVENTION

In accordance with the present invention, we have overcome the above-described problem using a technique which determines the performance of substrate-side (or bottom) emitting VCSELs while they are still part of the wafer. The technique involves forming top-emitting VCSELs on the same wafer as bottom-emitting VCSELs and then testing the top-emitting VCSELs and using the results to determine the performance of the bottom-emitting VCSELs of the wafer. The test results of the top-emitting VCSELs have been found to correlate well with the bottom-emitting VCSELs performance and to be a good indicator of the lasing wavelength and performance variations over the wafer. Using this technique once the test results of the top-emitting test VCSELs are determined, then the performance of the bottom-emitting VCSEL devices on the wafer can be determined and, if acceptable, the wafer can then be sawed or cut into individual VCSEL chips and utilized without individual testing of the VCSEL chips.

More particularly, in accordance with the present invention, a VCSEL wafer (and a method of forming the wafer) is disclosed including a plurality of substrate-side emitting VCSELs formed on the wafer, each including a top mirror having a metal reflecting cap formed thereon, the wafer also includes at least one VCSEL constructed having a top mirror without a metal reflecting cap formed thereon to enable top-surface emitting therefrom.

According to another feature of the invention, the non-capped VCSELs are formed in saw-cut regions of the wafer. Other features describe the formation of the top and bottom mirrors of the VCSEL using a variety of materials and specify reflectivities for the top and bottom mirrors.

BRIEF DESCRIPTION OF THE DRAWING

In the drawing,

FIG. 9 shows a cross-sectional view of a bottom-surface emitting VCSEL device flip-chip after being mounted to a semiconductor circuit chip and having its substrate removed; and.

DETAILED DESCRIPTION

In the following description, each item or block of each figure has a reference designation associated therewith, the first number of which refers to the figure in which that item is first located (e.g., 101 is located in FIG. 1).

In accordance with the present invention, we describe a technique which determines the performance of substrate-side (or bottom) emitting vertical-cavity surface emitting lasers (VCSELs) while they are still part of the wafer. The technique involves forming top-emitting VCSELs on the same wafer as bottom-emitting VCSELs and then testing the top-emitting VCSELs and using the results to determine the performance of the bottom-emitting VCSELs of the wafer. The test results of the. top-emitting VCSELs have been found to correlate well with the bottom-emitting VCSELs performance and to be a good indicator of the lasing wavelength and performance variations over the wafer. Using this technique once the test results of the top-emitting test VCSELs are determined, then the performance of the bottom-emitting VCSEL devices on the wafer can be determined and, if acceptable, the wafer can then be sawed or cut into individual VCSEL chips and utilized without individual testing of the VCSEL chips.

The bottom-emitting VCSELs are designed to have a metal reflector cap deposited on the top mirror and the topemitting VCSELs are designed without the metal reflector cap. The procedure is to design the top mirror of the VCSEL so that without a cap of highly reflective metal (gold, silver, or copper), it has a reflectivity sufficiently equal to that of the bottom output coupler mirror (typically 99.5%). This non-capped VCSEL when tested will then emit sufficient light through the top surface (top mirror) to enable measurement of the laser wavelength and other performance characteristics. The VCSELs with the metal cap over the top mirror form a highly reflective top mirror (typically >99.9%). So on the same wafer, both capped VCSELs (to be used for bonding to semiconductor chips) and non-capped VCSELs (used for testing purposes) are patterned and formed. The top and bottom mirrors of our illustrative VCSEL are formed using three different possible material mirrors, that due to phase-matching of the metal cap to the quarter-wave mirror stack, have the top high-index layer of the stack adjusted to be somewhat larger than a quarter-wave thickness.

Figure 1:
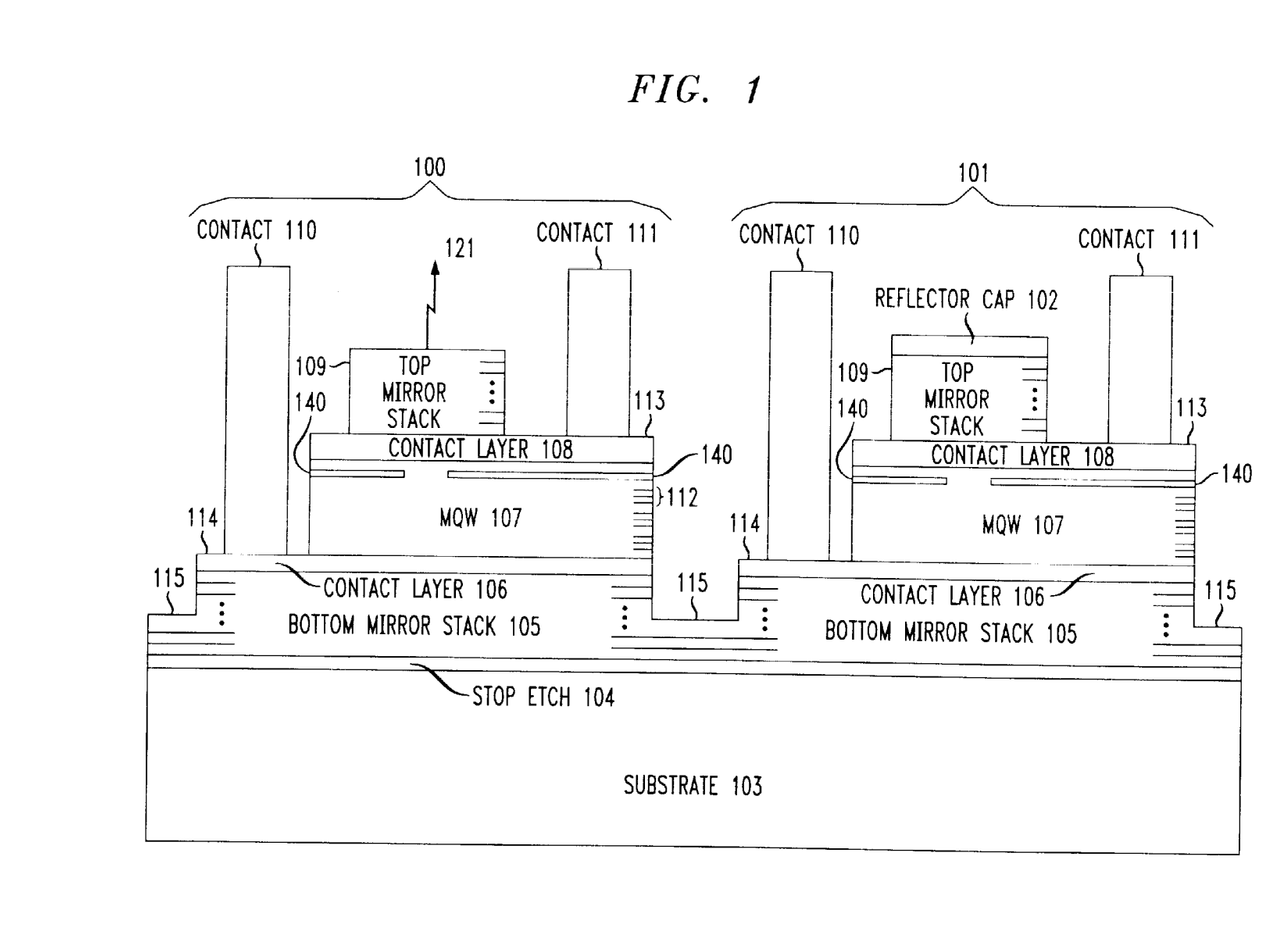
FIG. 1 shows a cross-sectional view of illustrative top-emitting and bottom-emitting vertical-cavity surface emitting lasers (VCSELs), formed together on the same wafer.
Figure 7:
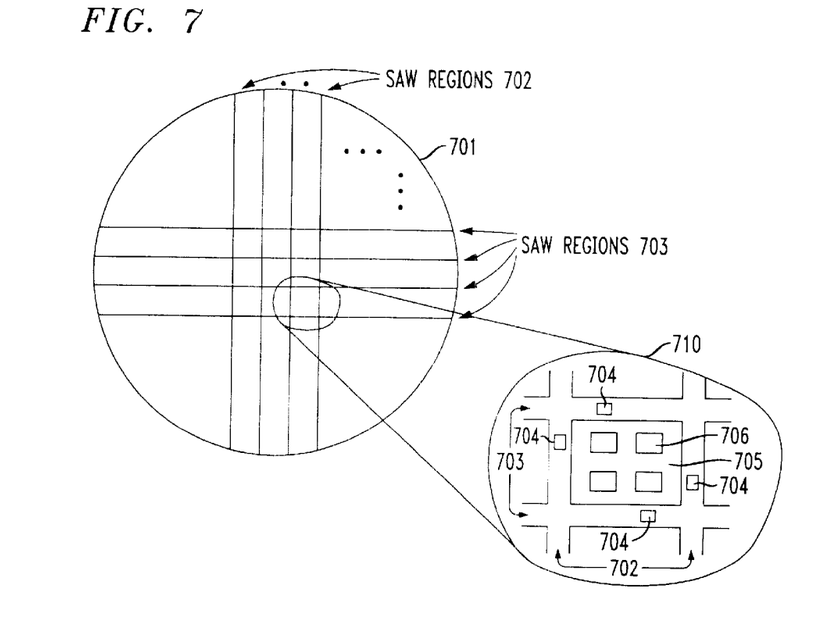
FIG. 7 shows an illustrative wafer and the saw regions used to cut the wafer into a plurality of VCSEL chips.

Shown in FIG. 1 is an illustrative cross-sectional view of two VCSEL devices, which are part of a plurality of VCSEL devices formed on a wafer (e.g., 701 of FIG. 7). VCSEL device 100 is identical to VCSEL device 101 except for the metal reflector cap 102 formed on top mirror stack 109. Both VCSEL devices are formed on a GaAs substrate 103 and are shown to include bottom mirror stack 105, lower multiple quantum well (MQW) contact. layer 106, MQW cavity 107, upper MQW contact layer 108, top mirror stack 109 and contacts 110 and 111 for providing electrical contact to the contact layers 106 and 108, respectively. A current aperture 140 optically confines carriers to obtain index guiding in the laser. The aperture can be made with AlOx or implanted AlGaAs to enable conductivity only through the aperture. When the aperture is $AlO_x$ the unoxidized layer is Al As with carrier concentration of $3 \times 10^{17}$ cm $^{-3}$. When the aperture is implanted, the layer is made from AlGaAs (x=0.3) and the carrier concentration is also $3 \times 10^{17}$ cm $^{-3}$. Note, the size of the various parts of the VCSEL devices are for illustrative purposes only and, thus, are not shown to scale.

Figure 3:
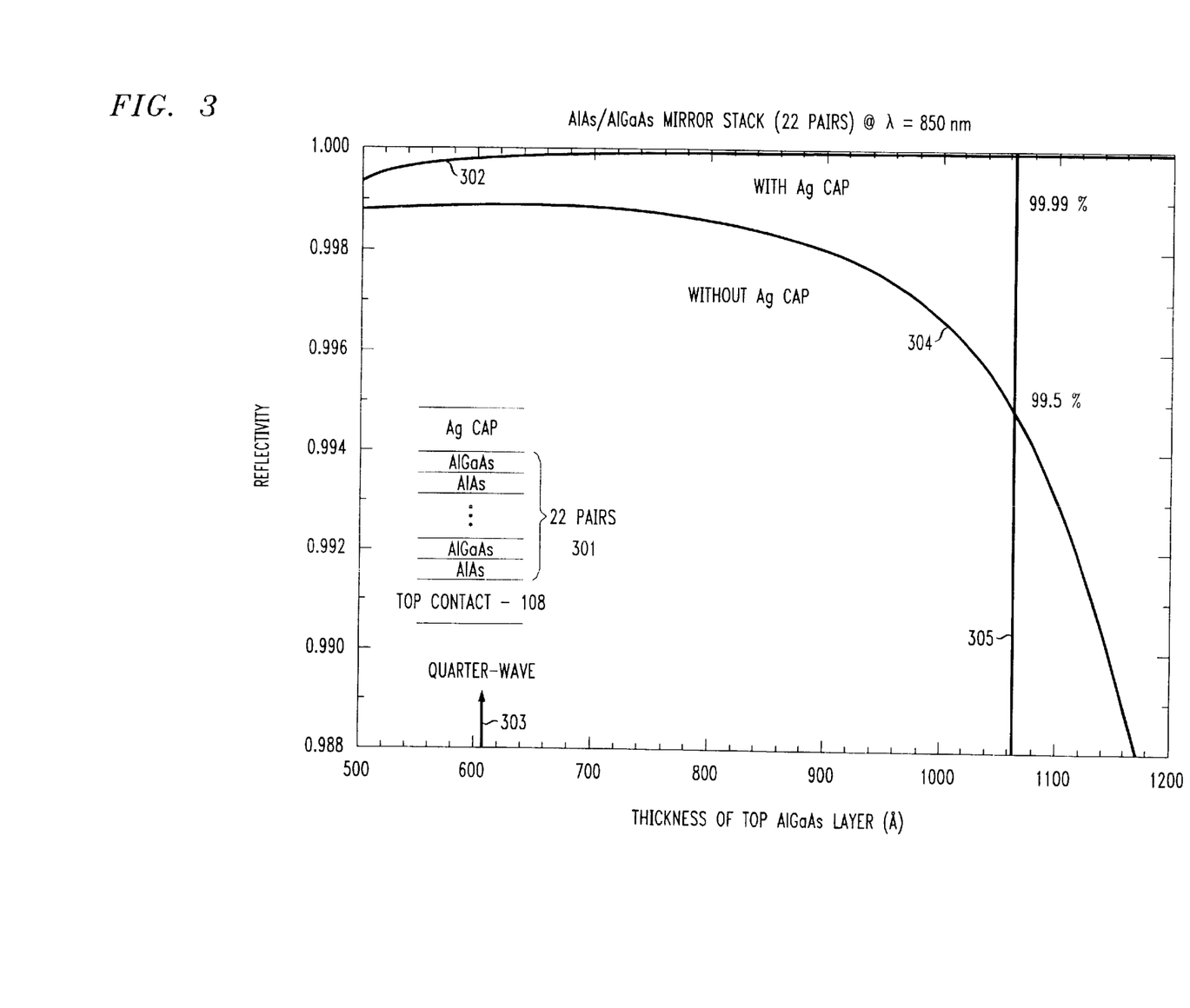
FIG. 3 shows, for a 850 nm wavelength VCSEL, the reflectivity versus thickness of the top mirror layer of a AlAs/AlGaAs mirror stack.
Figure 4:
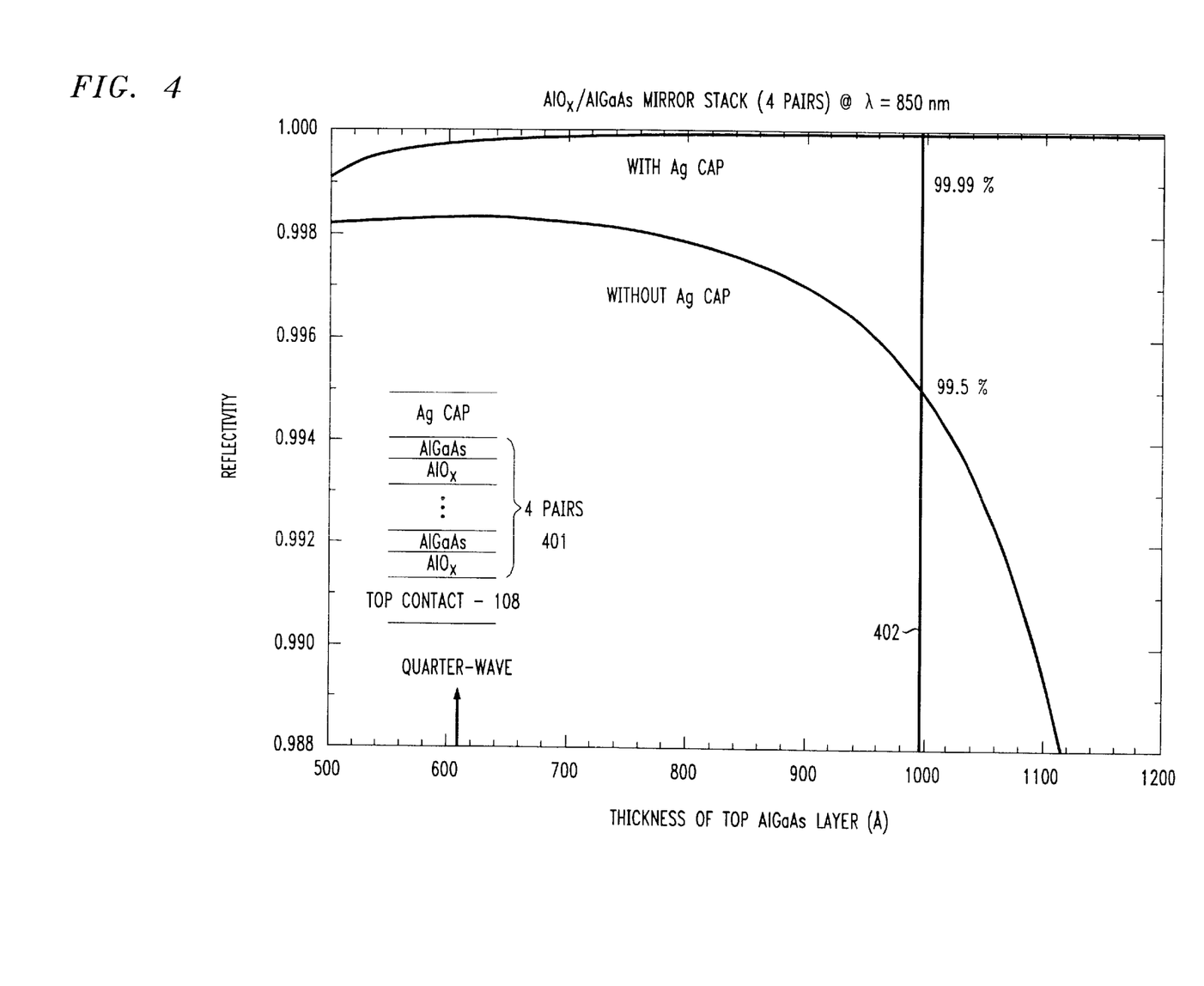
FIG. 4 shows, for a 850 nm wavelength VCSEL, the reflectivity versus thickness of the top mirror layer of a AlOx/AlGaAs mirror stack.
Figure 5:
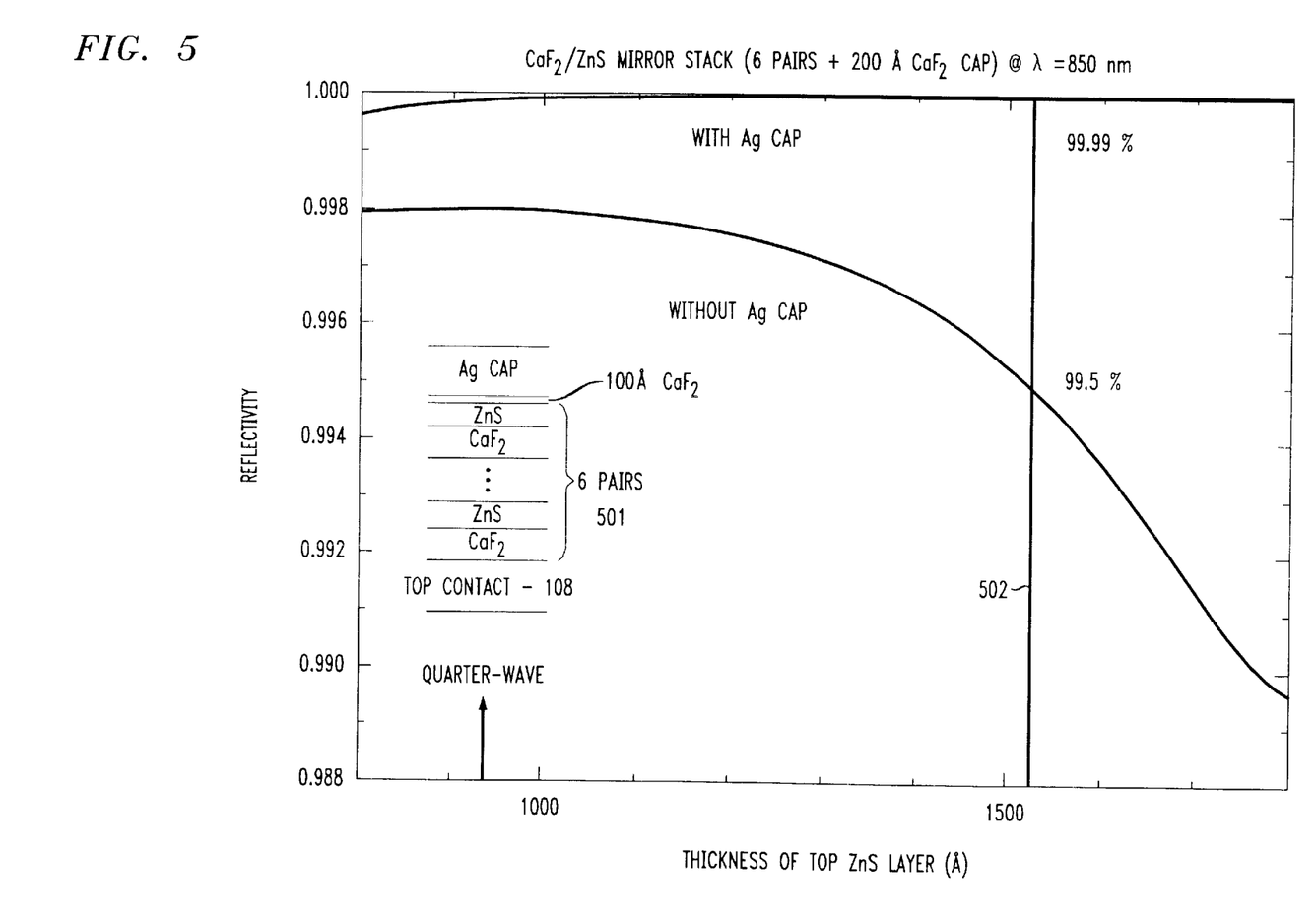
FIG. 5 shows, for a 850 nm wavelength VCSEL, the reflectivity versus thickness of the top mirror layer of a $CaF_2$/ZnS mirror stack.

The top 109 and bottom 105 mirror stacks can be formed using a variety of different materials. With reference to FIG. 3, one illustrative 850 nm wavelength VCSEL embodiment utilizes an AlAs/AlGaAs mirror stack 301 including 22½ pairs of these materials for the top and bottom mirror stacks. With reference to FIG. 4, another illustrative 850 nm wavelength VCSEL embodiment utilizes an AlOx/AlGaAs mirror stack 401 including 4 pairs of these materials for the top and bottom mirror stacks. With reference to FIG. 5, yet another illustrative 850 nm wavelength VCSEL embodiment utilizes an $CaF_2$/ZnS mirror stack 501 including 6 pairs of these materials for the top and bottom mirror stacks. The top stack 501 also includes a 200 Å $CaF_2$ cap because $CaF_2$ is hard, whereas ZnS is soft and has poorer metal adhesion.

Figure 2:
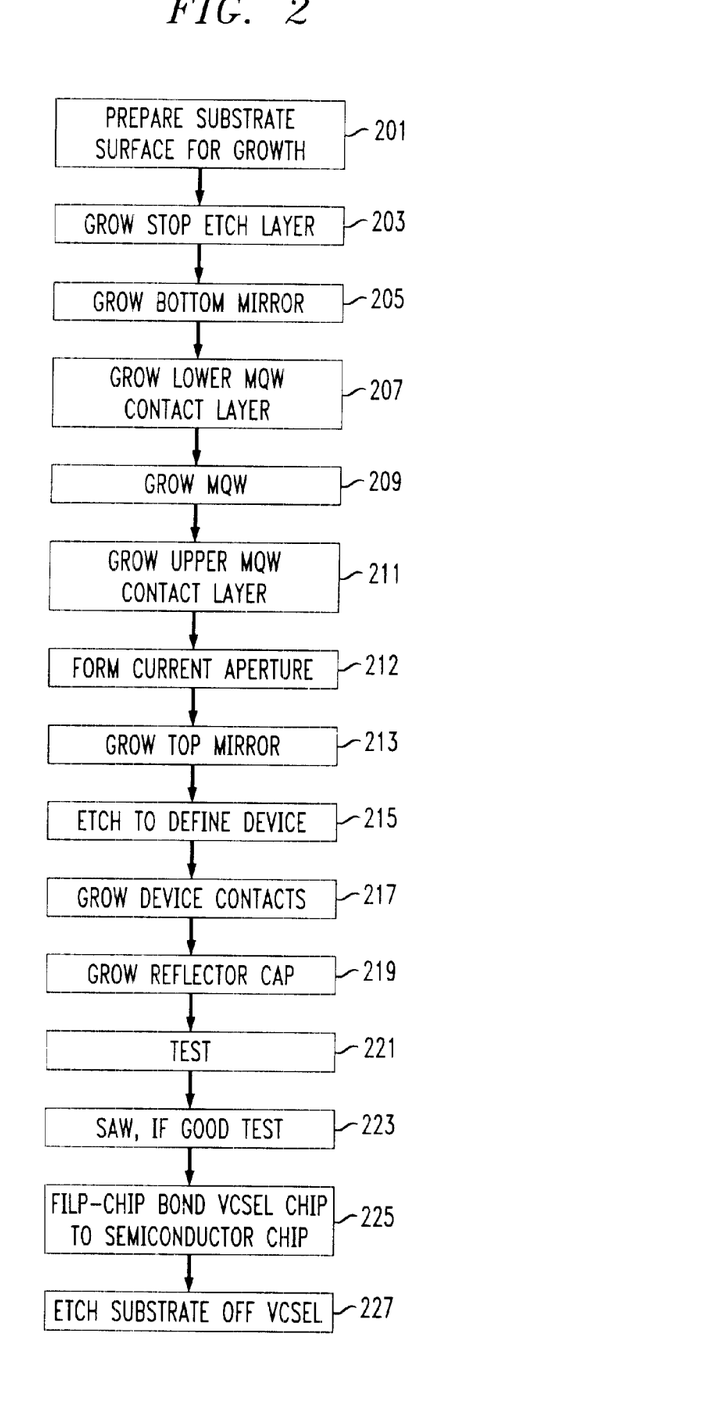
FIG. 2 shows, in accordance with the present invention, an illustrative flow chart describing the processing steps for making, testing of the top-emitting VCSEL devices, and the mounting of the bottom-emitting VCSEL devices to a semiconductor chip.

FIG. 2 shows, in accordance with the present invention, a simplified illustrative flow chart describing the processing steps for making and testing the VCSEL devices 100 and 101 of FIG. 1 on a wafer. The following description makes reference to FIGS. 1 and 2 and assumes that the VCSEL devices 100 and 101 of FIG. 1 use AlAs/AlGaAs mirror stacks (105 and 109) and that the MQW 107 includes three quantum wells 112. Each of the quantum wells 112 is formed, in a well known manner, using three GaAs layers, with each GaAs layer being interspersed with an $Al_{0.3}Ga_{0.7}As$ barrier layer. It should be noted that other MQW arrangements involving different number of wells and well structures can be utilized.

With reference to FIG. 2, we describe the processing steps needed to form the VCSELs 100 and 101. To simplify the description, the following steps do not describe the well known mask forming and mask removing steps required to obtain the patterns needed to deposit and etch the various parts of the VCSELs 100 and 101. The manufacture of the VCSEL devices of FIG. 1 utilizes gas-source molecular beam epitaxy to perform the following fabrication steps:

In step 201, preparing the GaAs substrate 103 for growth by desorbing the oxide.

In step 203, growing the stop etch layer 104 using AlGaAs or InGaP material.

In step 205, growing the AlAs/AlGaAs bottom mirror stack 105 by alternately depositing quarter wavelength layers of AlAs and AlGaAs materials, as shown in FIG. 3. This process is repeated 22½ times to form 22½ AlAs AlGaAs pairs. The bottom mirror stack 105 is designed to have a reflectivity), typically about 99.5%, which approximately is equal to the reflectivity of the top mirror stack 109 (without the metal reflector cap 102) For the bottom-emitting VCSEL 101, the bottom mirror stack 105 also functions as a bottom output coupler mirror to output the laser light.

In step 207, growing the lower MQW contact layer 106 using a p or n type semiconductor material, such as AlGaAs or InGaP doped with Si for n type and Be or C for p type. AlGaAs and InGaP are representative materials lattice matched to GaAs for good epitaxy, yet are transparent at 850 nm.

In step 209, growing the MQW cavity starting with a $Al_{0.3}Ga_{0.7}As$ barrier layer of a predetermined thickness. As shown in FIG. 1, in our example, the MQW includes three quantum wells 112. Illustratively, each quantum well is formed from three GaAs layers of a predetermined thickness, each pair of GaAs layers being interspersed with a barrier layer of $Al_{0.3}Ga_{0.7}As$ of a predetermined thickness. Each quantum well is separated by a $Al_{0.3}Ga_{0.7}As$ barrier layer of a second predetermined thickness. It should be noted that the thickness of the various quantum well layers is selected in a well known manner to determine the wavelength of the VCSEL device.

In step 211, growing the upper MQW contact layer 108 using an n or p type semiconductor material, such as AlGaAs or InGaP doped with Si for n type and Be or C for p type. In step 211 the doping is opposite type to step 207 in order to form a p-n junction.

In step 212, forming a current aperture 140.

In step 213, growing the AlAs/AlGaAs top mirror stack 105 by alternately depositing quarter wavelength layers of AlAs and AlGaAs, as shown in FIG. 3. This process is repeated 22 times to form 22 AlAs/AlGaAs pairs. In accordance with the present invention, the top mirror stack is designed so that VCSEL 100, without a metal reflector cap 102, will have a reflectivity sufficient to equal the bottom output coupler mirror (typically about 99.5%) For the top-emitting VCSEL 100, the top mirror stack 109 also functions as a coupler mirror to output the laser light.

In step 215, well known etching steps are performed to individually separate and form the various sections of VCSELs 100 and 101. Illustratively, the first etching step etches all but the top mirror stack 109 areas to a level 113, to enable access the to upper contact layer 108. The next etching step etches all but the top mirror stack 109 and upper contact layer 108 down to a level 115, to enable access to the lower contact layer 106. The final etching step etches only the region 115 to a predetermined depth in the bottom mirror stack 105. This etching step is used to separate and isolated the VCSEL device 100 from VCSEL device 101. Steps 213 and 215 can be interchanged in order to make VCSELs with ZnS/$CaF_2$ top mirrors.

In step 217, if the contacts 110 and 111 are alloyed contacts (requiring a high temperature), they are grown at this time. However, if the contacts 110 and 111 are non-alloyed contacts, they can be grown after the metal reflector cap 102 is grown (step 219). This will be the case when growing the contacts 110 and 111 require a temperature that is lower than the temperature needed for the growing of the metal reflector cap 102. In one example, the contacts 110 and 111 are made using a gold alloy (which has a higher melting temperature than that of the metal reflector cap materials) and so contacts 110 and 111 are formed prior to the formation of metal reflector cap 102.

In step 219, the metal reflector cap 102 is grown, but only on the VCSEL device 101. The metal reflector cap 102 is preferably made of silver, but gold or copper can also be used. The cap is typically made 1500 Å thick. If silver or copper is used it may be capped with gold to prevent corrosion. This does not affect the optical properties since it is the semiconductor side of the metal cap that affects the lasing light.

In step 221, a dc current is applied to across the contacts 110 and 111 and the operating characteristics of the top-surface emitting VCSEL device 100 is tested. Of particular importance is the wavelength and the efficiency of the emitted laser light 121. The test may be conducted on a plurality of VCSELS 100 formed at several locations of the wafer. The results are used to project the operating characteristics of the bottom-emitting VCSEL devices 101. Generally, if the test results are bad at any location on the wafer, the wafer is discarded.

In step 223, with reference to FIG. 7, if the test results on the top-emitting VCSELs 100 indicate that the wafer 701 is good then it is sawed along the saw regions 702 and 703 to create individual bottom-emitting VCSEL chips (705 of FIG. 7). In accordance with the present invention, when the test results on the top-emitting VCSELs, i.e., 100, are considered good, the separated bottom-emitting VCSEL chips 101 are utilized without the need to be individually tested.

Figure 8:
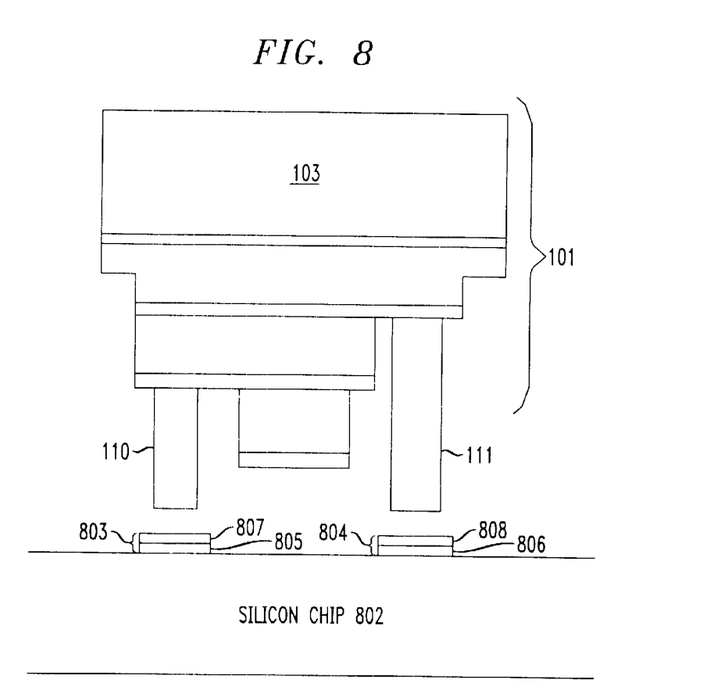
FIG. 8 shows a cross-sectional view of a bottom-surface emitting VCSEL device positioned for flip-chip mounting to a semiconductor circuit chip.
Figure 9:
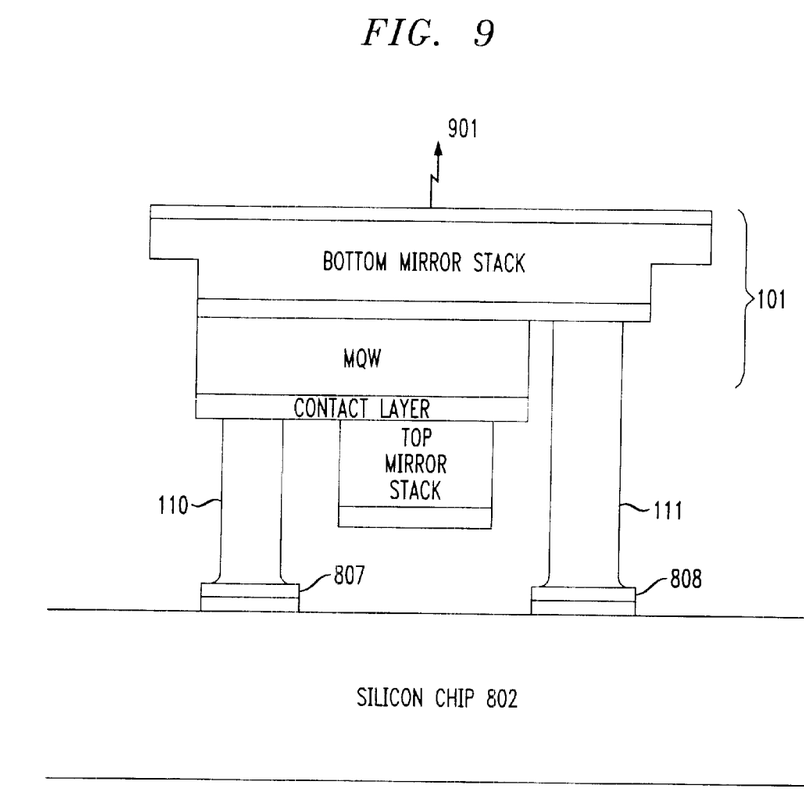

In step 225, a separate bottom-emitting VCSEL device, i.e., 705 of FIG. 7, is obtained and flipped over, as shown in FIG. 8 for flip-chip mounting to an semiconductor chip (as shown in FIG. 9).

In step 227, with reference to FIG. 9, after the bottom-emitting VCSEL device 101 is flip-chip mounted to the semiconductor chip 802, the substrate (103 of FIG. 8). is etched away in a well known manner. When a dc current is applied across contacts 110 and 111, the bottom-emitting VCSEL device 101 outputs its laser signal 901.

With reference to FIG. 3 there is shown, for an 850 nm wavelength VCSEL, an illustrative reflectivity characteristics versus thickness of the top AlGaAs layer of a AlAs/AlGaAs mirror stack (22 pairs). As shown, for a mirror stack with a silver (Ag) reflecting cap, curve 302, at a typical quarter wavelength, 303, thickness of top AlGaAs layer of about 606 Å the reflectivity is about 99.97%. This reflectivity is shown to increase toward 99.99% with increased thickness of the top AlGaAs layer. For a mirror stack without a gold reflecting cap, curve 304, at a typical quarter wavelength thickness, 303, of the top GaAs layer, the reflectivity is about 99.86%. To enable a non-capped VCSEL 100 (one without the metal reflecting cap) to emit from its top-surface (top mirror), it is desirable for the top mirror stack to have about the same reflectivity, 99.5%, as that of the bottom mirror stack. For a non-cap VCSEL 100, by using a top AlGaAs layer thickness of about 1062 Å, 305, a reflectivity of about 99.5% can be obtained, ensuring good top-surface emissions for the VCSEL devices 100. However, to ensure efficient laser operation of the bottom emitting VCSEL devices 101, it is desirable that the top mirror stack 109 have as high a reflectivity as possible. These competing interest are both met by depositing a metal reflector cap 102 on the VCSEL devices 101. By placing a metal cap over the top AlGaAs layer of the top mirror 109 the capped VCSELs 101 will have a top mirror reflectivity of 99.99%, ensuring efficient bottom-emitting laser operation for the manufactured VCSEL devices 101, while the non-capped VCSELS 100 will have a reflectivity, 99.5%, that is sufficient to ensure good top-emitting laser operation. The point is, to optimize the top emitter, a quarter-wavelength thick top AlGaAs layer is used, but to optimize the bottom emitter, an approximate 7/16 wavelength is used. Therefore, the top layer is between these values, but weighted toward 7/16 wavelength since it is a bottom emitter when it is soldered.

Shown in FIG. 4 is the reflectivity versus thickness characteristics of the top AlGaAs layer of an illustrative AlOx/AlGaAs mirror stack (4 pairs) which may also be used in a VCSEL device which operates at a λ=850 nm wavelength. As shown, for a non-capped VCSEL 100, by using a top AlGaAs layer thickness of about 998 Å, 402, the reflectivity is about 99.5% ensuring good test VCSEL 100 devices while the capped VCSELs will have a top mirror reflectivity of 99.99%, ensuring efficient laser operation for the capped VCSEL devices 101.

Shown in FIG. 5 is the reflectivity versus thickness characteristics of the top mirror layer of an illustrative $CaF_2$/ZnS mirror stack (6 pairs+200 Å $CaF_2$ cap ) which may also be used in a VCSEL device which operates at a λ=850 nm wavelength. As shown, for a capless VCSEL 100, by using a top ZnS layer thickness of about 1520 Å the reflectivity is about 99.5% ensuring good test VCSEL 100 devices while the capped VCSELs will have a top mirror reflectivity of 99.99%, ensuring efficient laser operation for the manufactured VCSEL devices 101. As shown in the inset this arrangement a 100 Å $CaF_2$ cap is used to protect the soft ZnS layer from scratches or other damage. Note that other mirror materials known to those skilled in the art can be used using similar reasoning.

Figure 6:
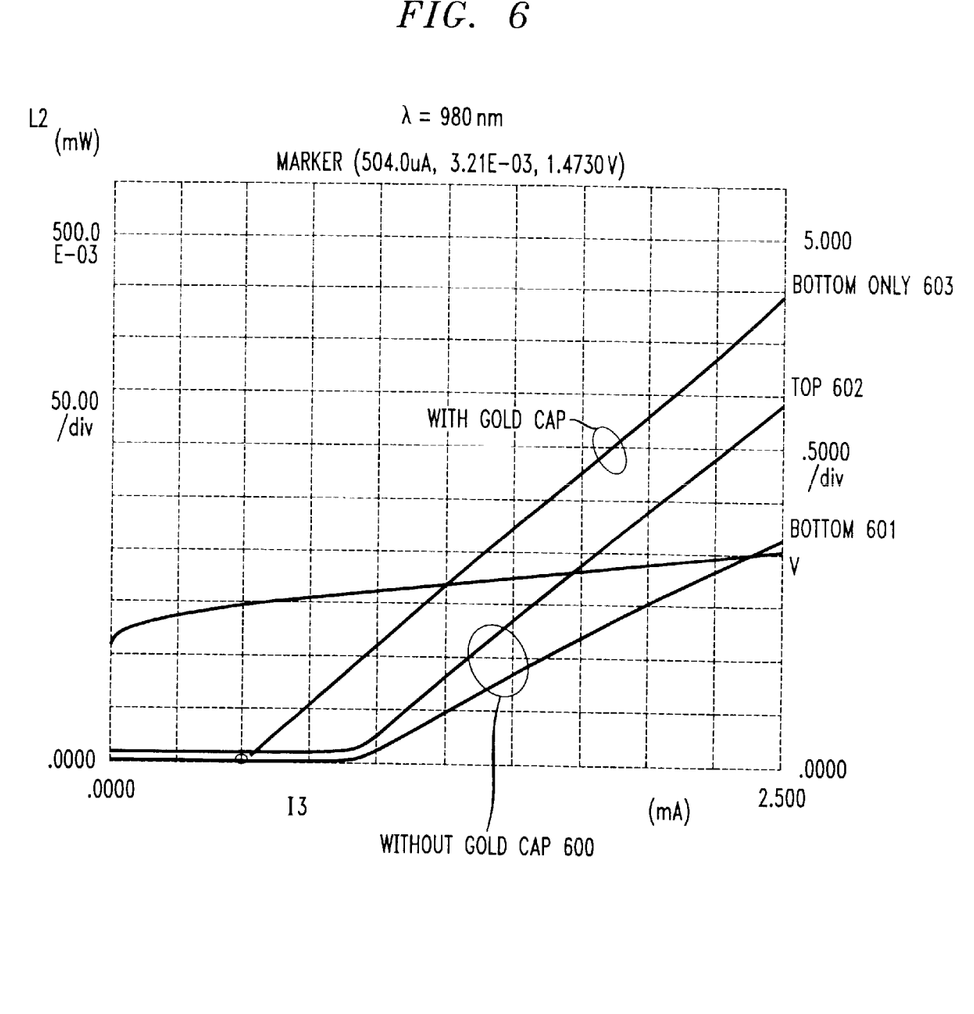
FIG. 6 shows, for a 980 nm wavelength VCSEL, illustrative top and bottom surface laser emission versus drive current for a top mirror with and without a metal cap.
Figure 10:
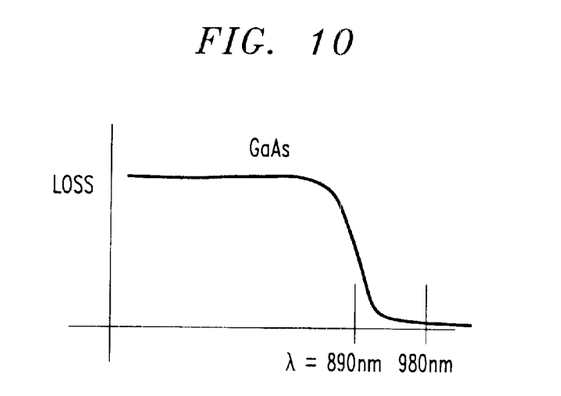
FIG. 10 shows the variation in absorption loss with wavelength for a GaAs substrate.

Shown in FIG. 6 are illustrative results for VCSEL test devices, operating at a μ=980 nm wavelength, which shows the optical output power versus bias current for both non-capped, 600, and capped, 603, VCSEL devices. The test VCSEL devices were made to operate at 980 nm so that the bottom-surface emission of the capped VCSEL device can be measured through the substrate. As shown in FIG. 10, GaAs substrate has an absorption bandwidth of about 890 nm, so that wavelengths below about 890 nm are absorbed while wavelengths above 890 nm, such as 980 nm, are not significantly absorbed. Returning to FIG. 6, for a non-capped capped VCSEL device, the bottom-surface emission power is shown by the curve 601, while the top-surface emission power is shown by curve 602. As shown, without the cap the VCSEL emits more light from the topsurface than from the bottom-surface. For the capped VCSEL only bottom emission, curve 603, is possible (since the cap is totally, 99.99%, reflective). Note that for any given bias current, the bottom-surface emission curve 603 of the capped VCSEL device exceeds (and closely tracts at an fairly constant offset) the top-surface emission curve 602 of the non-capped VCSEL device. Moreover, both the bottom-surface emission curve 603 of the capped VCSEL device and the top-surface emission curve 602 of the non-capped VCSEL device vary almost linearly with bias current (once they are turned-on). This nearly constant offset relationship indicates that the measured light output from the non-capped VCSEL device (top-surface emission curve 602) could be used to fairly accurately project the laser light emitted from the bottom-surface of the capped VCSEL device (i.e., curve 603). Additionally, the results of this test indicate that the laser wavelength and laser mode characteristics at both the top and bottom surfaces were about the same.

While the results of FIG. 6 were obtained at a non-absorbed wavelength of 980 nm (so that the bottom-surface emission of the capped VCSEL device could be measured), the same relationship exists for VCSELs operating at wavelengths below 890 nm (within the absorption bandwidth of the GaAs substrate). Thus, by measuring the light output of the top-surface of the non-capped VCSELs (704 of wafer 701) we can obtain accurate projections of the operating characteristics of the capped VCSEL devices (705 of FIG. 7) that are being manufactured.

With reference to FIG. 7, there is shown the rectilinear saw regions 702 and 703 by which the wafer 701 is cut into discrete VCSEL chips, such as shown by 710. In accordance with an aspect of the invention, the non-capped VCSEL devices (704), used for test purposes, are formed in the saw regions, 702 and 703, so as not to affect the number of capped VCSEL chips (705) that can be produced on each wafer 701. Note, as shown, each VCSEL chip 705 may include one or more VCSELs 706. As previously described the non-capped VCSEL devices, 704, are tested before the wafer is sawed into discrete capped VCSEL chips, 705. This is accomplished by connecting a bias current across the contacts 110 and 111 and monitoring the top-surface emission from the non-capped VCSEL devices. Typically, several non-capped VCSEL devices are tested from different regions of the wafer 701 to ensure that VCSEL devices are good over the whole wafer. These tests are done before the wafer is sawed and are used to determine lasing wavelength, laser modes, laser efficiency and laser variation over the wafer. Testing on a wafer has the advantage that it is easier to accomplish and is less time consuming than the testing of individual VCSEL chips. Moreover, if the tests results are not favorable the wafer is discarded without wasting any more time or effort in wafer processing. If the test results indicate that the wafer 701 is good, then the wafer is sawed along the saw regions 702 and 703 and the resulting individual capped VCSEL chips can be further processed, mounted or packaged.

After the wafer is sawed the capped VCSEL chips can be mounted to a semiconductor chip, e.g., 802, (usually a Si CMOS chip) thereby forming, for example, an integrated opto/electronic chip. FIG. 8 shows a cross-sectional view of a capped (bottom-emitting) VCSEL device 101 positioned for flip-chip bonding to a semiconductor circuit chip 802. The silicon chip 802, illustratively, has bonding pads 803 and 804 prepared in a well known manner, for example see U.S. Pat. No. 5,385,632, issued on Jan. 31, 1995, which is incorporated by reference herein. Illustratively, the semiconductor chip 802 has aluminum (Al) contacts 805 and 806 of the appropriate mating size and spacing as the contacts 110 and 111, respectively, on VCSEL device chip 101. Indium or other solder alloy contacts 807 and 808 formed on the Al contacts 805 and 806, respectively, also have the appropriate size and spacing.

FIG. 9 shows a cross-sectional view of a capped VCSEL device chip 101 after it has been bonded to a semiconductor circuit chip 802. The capped VCSEL device chip 101 is aligned over and made to come in contact with semiconductor circuit chip 802. This is typically accomplished using a precision position controller. Thereafter, the unit is heated to about 200° C. for about 15 minutes to melt the indium or alloy cap on contacts 110 and 111 (of capped VCSEL device chip 101) to the indium or alloy contacts 807 and 808, respectively (of semiconductor circuit chip 802). The capped VCSEL chip 101 is thus rigidly bonded to semiconductor circuit chip 802.

While the VCSEL wafer manufacturing sequence has been described as first depositing all of the various layers and then etching to provide contact access and separate VCSEL devices, it should be understood that other sequences of deposition and etching could also be used to form the VCSEL wafer. Additionally, while several embodiments of top and bottom mirror and MQW manufacture have been disclosed, it is contemplated that other embodiments and methods of manufacture can be implemented by those skilled in the art without departing from the spirit and scope of the present invention.

We claim:

1. A method of making wafer including a plurality of vertical-cavity surface emitting lasers (VCSELs) comprising the steps of:

forming said plurality of VCSELs, each VCSEL including a top mirror and a bottom mirror having approximately the same reflectivity, and for a large fraction of said plurality of VCSELs, depositing a metal reflecting cap on the top mirror to thereby form substrate-side emitting VCSELs.

2. The method of claim 1 wherein the VCSELs not having the metal reflecting cap on the top mirror are formed in a saw-cut region of the wafer.

3. The method of claim 1 further including the step of:

forming surface-mountable electrical contacts for enabling flip-chip bonding of said substrate-side emitting VCSELs.

4. The method of claim 1 wherein the VCSEL forming step includes the step includes the step of:

forming a top and bottom mirrors which include a multiple pair AlOx/AlGaAs mirror stack.

5. The method of claim 1 wherein the VCSEL forming step includes the step of:

forming a top and bottom mirrors which include a multiple pair AlAsO/AlGaAs mirror stack.

6. The method of claim 1 wherein the VCSEL forming step includes the step of:

forming a top and bottom mirrors which include a multiple pair $CaF_2$/ZnS mirror stack.

7. The method of claim 6 wherein the $CaF_2$/ZnS mirror stack of the top mirror includes a top layer of $CaF_2$.

8. The method of claim 3 further including the step of:

testing at least one of the VCSELs not having a metal reflecting cap to determine operating characteristics of said substrate-side emitting VCSELs of the wafer.

9. The method of claim 8 further including the step of:

sawing the wafer in saw cut regions to form a plurality of VCSEL chips, each chip including at least one VCSEL having metal reflecting cap.

10. The method of claim 9 further including the step of:

mounting at least one VCSEL chip by flip-chip bonding it to a semiconductor chip.

11. The method of claim 10 further including the step of:

etching-off the substrate of said mounted at least one VCSEL chip.

12. The method of claim 1 wherein the top and bottom mirrors of said plurality of VCSELs have a reflectivity of about 99.5%.

13. The method of claim 1 wherein the top mirror of the metal reflecting cap VCSELs has a reflectivity of at least 99.9% and wherein the bottom mirror has a reflectivity of at least 99.5%.

14. The method of claim 1, wherein said plurality of VCSELs are formed on a GaAs substrate.

* * * * *